United States Patent
Chang

(10) Patent No.: US 10,516,504 B2
(45) Date of Patent: Dec. 24, 2019

(54) TWO BIT ERROR CALIBRATION DEVICE FOR 256 BIT TRANSFER AND THE METHOD FOR PERFORMING THE SAME

(71) Applicant: Chin Pen Chang, New Taipei Hsien (TW)

(72) Inventor: Chin Pen Chang, New Taipei Hsien (TW)

( * ) Notice: Subject to any disclaimer, the term of this patent is extended or adjusted under 35 U.S.C. 154(b) by 58 days.

(21) Appl. No.: 15/915,083

(22) Filed: Mar. 8, 2018

(65) Prior Publication Data

US 2019/0280815 A1 Sep. 12, 2019

(51) Int. Cl.
*H04L 1/00* (2006.01)

(52) U.S. Cl.
CPC .......... *H04L 1/0045* (2013.01); *H04L 1/0061* (2013.01)

(58) Field of Classification Search
CPC .......................... H04L 1/0045; H04L 1/0061
See application file for complete search history.

(56) References Cited

U.S. PATENT DOCUMENTS

| | | | | |
|---|---|---|---|---|
| 2009/0210772 | A1* | 8/2009 | Noguchi | G06F 11/1068 714/764 |
| 2010/0277072 | A1* | 11/2010 | Draper | H05B 37/0218 315/149 |
| 2013/0094648 | A1* | 4/2013 | Goettfert | H04L 9/28 380/28 |
| 2016/0147600 | A1* | 5/2016 | Gao | G06F 11/1068 714/764 |

* cited by examiner

*Primary Examiner* — Kyle Vallecillo

(57) ABSTRACT

A method for determining two bits errors in transmission of 256 bits and the device for realization of this method is provided. By the method and device, the two error bits transferred bits can be determined and corrected by using least bits in operation. Therefore, the amount of data in transmission is increased with a least quantity and thus the transmission quality is not affected.

15 Claims, 13 Drawing Sheets

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 0th bit of 0th data set 50 | 1st bit of 0th data set 50 | X | X | X |   |   |   |   |   |   |   | X |   |   |
| 0th bit of 0th data set 50 | 2nd bit of 0th data set 50 | X | X |   |   | X |   |   |   | X | X | X |   | X |
| 0th bit of 0th data set 50 | 3rd bit of 0th data set 50 | X | X |   |   |   |   | X |   | X | X | X |   | X |
| 0th bit of 0th data set 50 | 0th bit of 1st data set 50 | X | X |   |   |   | X |   |   | X | X | X |   |   |
| 0th bit of 0th data set 50 | 1st bit of 1st data set 50 | X | X | X |   |   | X |   |   | X | X | X |   |   |
| 0th bit of 0th data set 50 | 2nd bit of 1st data set 50 | X | X |   |   | X | X |   |   | X | X | X |   |   |
| 0th bit of 0th data set 50 | 3rd bit of 1st data set 50 | X | X |   |   |   | X | X |   | X | X | X |   |   |
| 0th bit of 0th data set 50 | 0th bit of 2nd data set 50 | X | X |   | X |   |   |   |   | X | X | X | X | X |
| 0th bit of 0th data set 50 | 1st bit of 2nd data set 50 | X | X | X | X |   |   |   |   | X | X | X | X | X |
| 0th bit of 0th data set 50 | 2nd bit of 2nd data set 50 | X | X |   | X | X |   |   |   | X | X | X | X |   |
| 0th bit of 0th data set 50 | 3rd bit of 2nd data set 50 | X | X |   | X |   |   | X |   | X | X | X | X |   |
| 0th bit of 0th data set 50 | 0th bit of 3rd data set 50 | X | X |   |   |   |   |   | X | X | X | X | X |   |
| 0th bit of 0th data set 50 | 1st bit of 3rd data set 50 | X | X | X |   |   |   |   | X | X | X | X | X |   |
| 0th bit of 0th data set 50 | 2nd bit of 3rd data set 50 | X | X |   |   | X |   |   | X | X | X | X | X |   |
| 0th bit of 0th data set 50 | 3rd bit of 3rd data set 50 | X | X |   |   |   |   | X | X | X | X | X |   |   |
| 1st bit of 0th data set 50 | 2nd bit of 0th data set 50 |   | X | X |   | X |   |   |   | X |   | X |   | X |
| 1st bit of 0th data set 50 | 3rd bit of 0th data set 50 |   | X | X |   |   |   | X |   | X |   | X |   | X |
| 1st bit of 0th data set 50 | 0th bit of 1st data set 50 | X | X | X |   |   | X |   |   | X |   | X |   |   |

Fig. 7

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 1st bit of 0th data set 50 | 1st bit of 1st data set 50 |  | X | X |  |  |  |  |  | X |  | X |  |  |
| 1st bit of 0th data set 50 | 2nd bit of 1st data set 50 |  | X | X |  |  | X |  |  | X |  | X |  |  |
| 1st bit of 0th data set 50 | 3rd bit of 1st data set 50 |  | X | X |  |  | X | X |  | X |  | X |  |  |
| 1st bit of 0th data set 50 | 0th bit of 2nd data set 50 | X | X | X | X |  |  |  |  | X | X | X | X |  |
| 1st bit of 0th data set 50 | 1st bit of 2nd data set 50 |  | X | X | X |  |  |  |  | X |  | X |  |  |
| 1st bit of 0th data set 50 | 2nd bit of 2nd data set 50 |  | X | X | X | X |  |  |  | X | X | X | X | X |
| 1st bit of 0th data set 50 | 3rd bit of 2nd data set 50 |  | X | X | X |  |  | X |  | X |  | X |  | X |
| 1st bit of 0th data set 50 | 0th bit of 3rd data set 50 | X | X | X |  |  |  |  | X | X |  | X |  |  |
| 1st bit of 0th data set 50 | 1st bit of 3rd data set 50 |  | X | X |  | X |  |  | X | X |  | X | X |  |
| 1st bit of 0th data set 50 | 2nd bit of 3rd data set 50 |  | X | X |  |  |  | X | X | X |  | X |  | X |
| 1st bit of 0th data set 50 | 3rd bit of 3rd data set 50 |  | X | X |  | X |  | X |  |  | X | X |  | X |
| 2nd bit of 0th data set 50 | 0th bit of 1st data set 50 | X | X |  |  | X | X |  |  | X | X | X |  | X |
| 2nd bit of 0th data set 50 | 1st bit of 1st data set 50 |  | X | X |  | X | X |  |  |  | X | X |  | X |
| 2nd bit of 0th data set 50 | 2nd bit of 1st data set 50 |  | X |  | X | X | X |  |  |  | X | X |  | X |
| 2nd bit of 0th data set 50 | 3rd bit of 1st data set 50 | X |  |  | X | X | X |  |  |  | X | X | X | X |
| 2nd bit of 0th data set 50 | 0th bit of 2nd data set 50 |  | X |  | X | X |  | X |  |  | X | X |  | X |
| 2nd bit of 0th data set 50 | 1st bit of 2nd data set 50 |  | X | X | X | X |  |  |  |  | X | X |  | X |
| 2nd bit of 0th data set 50 | 2nd bit of 2nd data set 50 |  | X |  | X | X |  |  |  |  |  | X | X | X |
| 2nd bit of 0th data set 50 | 3rd bit of 2nd data set 50 |  | X |  | X | X |  | X |  |  | X | X |  |  |

Fig. 8

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 2nd bit of 0th data set 50 | 0th bit of 3rd data set 50 | X | | | | X | | | | | | X | X | X |
| 2nd bit of 0th data set 50 | 1st bit of 3rd data set 50 | | X | X | | X | | | X | | X | X | | X |
| 2nd bit of 0th data set 50 | 2nd bit of 3rd data set 50 | | X | | | X | | X | X | | X | X | X | X |
| 2nd bit of 0th data set 50 | 3rd bit of 3rd data set 50 | X | X | | | X | | X | X | | X | X | | X |
| 3rd bit of 0th data set 50 | 0th bit of 1st data set 50 | | X | | | | X | X | | X | | X | | X |
| 3rd bit of 0th data set 50 | 1st bit of 1st data set 50 | | X | X | | | X | X | | X | | X | X | X |
| 3rd bit of 0th data set 50 | 2nd bit of 1st data set 50 | | X | | | X | X | X | | | | X | | X |
| 3rd bit of 0th data set 50 | 3rd bit of 1st data set 50 | X | X | | | | X | X | | | | X | | X |
| 3rd bit of 0th data set 50 | 0th bit of 2nd data set 50 | | X | | X | | | X | | | X | X | X | X |
| 3rd bit of 0th data set 50 | 1st bit of 2nd data set 50 | | X | | X | X | | | | | | X | | X |
| 3rd bit of 0th data set 50 | 2nd bit of 2nd data set 50 | X | X | | X | | | X | | | | X | X | X |
| 3rd bit of 0th data set 50 | 3rd bit of 2nd data set 50 | | X | | | | | X | X | | | X | X | X |
| 3rd bit of 0th data set 50 | 0th bit of 3rd data set 50 | | X | X | | | | X | X | | | X | X | X |
| 3rd bit of 0th data set 50 | 1st bit of 3rd data set 50 | X | | | | | | X | X | | | X | | X |
| 3rd bit of 0th data set 50 | 2nd bit of 3rd data set 50 | | | | | X | X | | | | | X | X | X |
| 3rd bit of 0th data set 50 | 3rd bit of 3rd data set 50 | | | | | | X | X | | | | X | | |
| 1st bit of 1st data set 50 | 0th bit of 1st data set 50 | X | | X | | | X | | | X | | X | | |
| 1st bit of 1st data set 50 | 2nd bit of 1st data set 50 | | | X | | | X | | | X | | X | | |
| 1st bit of 1st data set 50 | 3rd bit of 1st data set 50 | | | X | | | | X | | X | | X | | |

Fig. 9

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 1st bit of 1st data set 50 | 0th bit of 2nd data set 50 | X | | X | X | | X | | | X | X | X | X | |
| 1st bit of 1st data set 50 | 1st bit of 2nd data set 50 | | | X | X | | X | | | X | | X | | |
| 1st bit of 1st data set 50 | 2nd bit of 2nd data set 50 | | | X | X | X | X | | | X | X | X | X | X |
| 1st bit of 1st data set 50 | 3rd bit of 2nd data set 50 | X | | X | X | | X | | | X | | X | X | X |
| 1st bit of 1st data set 50 | 0th bit of 3rd data set 50 | | | X | | | X | | | X | | X | | |
| 1st bit of 1st data set 50 | 1st bit of 3rd data set 50 | | | X | | | X | | | X | | X | X | |
| 1st bit of 1st data set 50 | 2nd bit of 3rd data set 50 | | | X | | X | X | X | X | | | X | | |
| 1st bit of 1st data set 50 | 3rd bit of 3rd data set 50 | X | | X | | X | X | X | X | X | | X | | |
| 2nd bit of 1st data set 50 | 0th bit of 1st data set 50 | | | | | X | X | X | X | | | X | | |
| 2nd bit of 1st data set 50 | 3rd bit of 1st data set 50 | X | | | X | X | X | | | | X | X | X | |
| 2nd bit of 1st data set 50 | 0th bit of 2nd data set 50 | | | | X | X | X | | X | | X | X | | |
| 2nd bit of 1st data set 50 | 1st bit of 2nd data set 50 | | | X | | X | X | X | | | | X | X | X |
| 2nd bit of 1st data set 50 | 2nd bit of 2nd data set 50 | X | | | X | X | X | | X | | | X | | |
| 2nd bit of 1st data set 50 | 3rd bit of 2nd data set 50 | | | | | | X | | X | | | X | X | |
| 2nd bit of 1st data set 50 | 0th bit of 3rd data set 50 | | | X | | X | X | | | | | X | X | |
| 2nd bit of 1st data set 50 | 1st bit of 3rd data set 50 | | | | | | X | | | | | X | | |
| 2nd bit of 1st data set 50 | 2nd bit of 3rd data set 50 | | | | | X | X | X | | | | X | X | |
| 2nd bit of 1st data set 50 | 3rd bit of 3rd data set 50 | | | | | | X | X | | X | | X | | |
| 3rd bit of 1st data set 50 | 0th bit of 1st data set 50 | X | | | | | X | | | X | | X | | |

Fig. 10

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 3rd bit of 1st data set 50 | 0th bit of 2nd data set 50 | X | | | X | | X | X | | | X | X | X | |
| 3rd bit of 1st data set 50 | 1st bit of 2nd data set 50 | | | X | X | | X | X | | | | X | | |
| 3rd bit of 1st data set 50 | 2nd bit of 2nd data set 50 | | | | X | X | X | X | | | X | X | X | X |
| 3rd bit of 1st data set 50 | 3rd bit of 2nd data set 50 | X | | | X | | X | X | X | | | X | X | |
| 3rd bit of 1st data set 50 | 0th bit of 3rd data set 50 | | | X | | | X | X | X | | | X | | |
| 3rd bit of 1st data set 50 | 1st bit of 3rd data set 50 | | | | | X | X | X | X | | X | X | X | X |
| 3rd bit of 1st data set 50 | 2nd bit of 3rd data set 50 | X | | | | X | X | X | | X | | X | X | X |
| 3rd bit of 1st data set 50 | 3rd bit of 3rd data set 50 | X | | X | X | X | X | | | | X | X | X | X |
| 2nd bit of 2nd data set 50 | 0th bit of 1st data set 50 | | | | X | X | | X | | | X | X | X | X |
| 2nd bit of 2nd data set 50 | 1st bit of 2nd data set 50 | | | X | X | X | | | X | | X | X | X | X |
| 2nd bit of 2nd data set 50 | 2nd bit of 2nd data set 50 | X | | | X | X | | | X | | X | X | X | X |
| 2nd bit of 2nd data set 50 | 3rd bit of 2nd data set 50 | | | | X | | | | | X | X | X | X | X |
| 2nd bit of 2nd data set 50 | 0th bit of 3rd data set 50 | | | | X | | | X | X | | X | X | X | X |
| 2nd bit of 2nd data set 50 | 1st bit of 3rd data set 50 | | | | X | | X | X | X | | X | | X | X |
| 2nd bit of 2nd data set 50 | 2nd bit of 3rd data set 50 | X | | | X | | | X | | | X | X | | X |
| 3rd bit of 2nd data set 50 | 0th bit of 1st data set 50 | X | | | X | | X | | | | X | X | X | X |
| 3rd bit of 2nd data set 50 | 0th bit of 2nd data set 50 | X | | | X | | | X | | | | X | X | X |
| 3rd bit of 2nd data set 50 | 1st bit of 2nd data set 50 | | | X | X | | | X | | | | X | | X |

Fig. 11

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 3rd bit of 2nd data set 50 | 0th bit of 3rd data set 50 | X | | | X | | | X | X | | | X | X | X |
| 3rd bit of 2nd data set 50 | 1st bit of 3rd data set 50 | | | X | X | | | X | X | | | X | | X |
| 3rd bit of 2nd data set 50 | 2nd bit of 3rd data set 50 | | | | X | X | | X | X | | | X | X | X |
| 3rd bit of 2nd data set 50 | 3rd bit of 3rd data set 50 | | | | X | | | X | X | | | X | | |
| 3rd bit of 3rd data set 50 | 0th bit of 1st data set 50 | X | | | | | X | X | X | X | | X | X | |
| 3rd bit of 3rd data set 50 | 0th bit of 2nd data set 50 | X | | | X | | | X | X | | X | X | X | |
| 3rd bit of 3rd data set 50 | 1st bit of 2nd data set 50 | | | X | X | | | X | X | | | X | | |
| 3rd bit of 3rd data set 50 | 0th bit of 3rd data set 50 | X | | | | | | X | X | | | X | X | |
| 3rd bit of 3rd data set 50 | 1st bit of 3rd data set 50 | | | X | | | | X | X | | | X | X | |
| 3rd bit of 3rd data set 50 | 2nd bit of 3rd data set 50 | | | | | X | | X | X | | | X | X | |
| 0th bit of 1st data set 50 | 0th bit of 2nd data set 50 | X | | | X | | X | | | X | X | X | X | |
| 0th bit of 1st data set 50 | 1st bit of 2nd data set 50 | X | | X | X | | X | | X | X | | X | | |
| 0th bit of 1st data set 50 | 0th bit of 3rd data set 50 | X | | | | | X | | X | X | | X | X | |
| 0th bit of 1st data set 50 | 1st bit of 3rd data set 50 | X | | X | | | X | | X | X | | X | | |
| 0th bit of 1st data set 50 | 2nd bit of 3rd data set 50 | X | | | | X | | | | | X | X | X | |
| 0th bit of 2nd data set 50 | 1st bit of 2nd data set 50 | X | | X | X | | | | X | | X | X | X | |
| 0th bit of 2nd data set 50 | 0th bit of 3rd data set 50 | X | | | X | | | X | | | X | X | X | |
| 0th bit of 2nd data set 50 | 1st bit of 3rd data set 50 | X | | X | | | | X | X | | X | X | X | |
| 0th bit of 2nd data set 50 | 2nd bit of 3rd data set 50 | X | | | X | X | | X | X | | X | X | X | |

Fig. 12

| 1st error transferring bit | 2nd error transferring bit | cb1 | cb2 | cb3 | cb4 | cb5 | cb6 | cb7 | cb8 | cb17 | cb18 | cb19 | cb20 | cb21 |
|---|---|---|---|---|---|---|---|---|---|---|---|---|---|---|
| 1st bit of 2nd data set 50 | 0th bit of 3rd data set 50 | X | | X | X | | | | X | | | X | X | |
| 1st bit of 2nd data set 50 | 1st bit of 3rd data set 50 | | | X | X | X | | | X | | | X | | |
| 1st bit of 2nd data set 50 | 2nd bit of 3rd data set 50 | | | X | | | | | X | | | X | X | |
| 0th bit of 3rd data set 50 | 1st bit of 3rd data set 50 | X | | | | | | | X | | | X | X | |
| 0th bit of 3rd data set 50 | 2nd bit of 3rd data set 50 | X | | | | X | | | X | | | X | X | |
| 1st bit of 3rd data set 50 | 2nd bit of 3rd data set 50 | | | X | | X | | | X | | | X | X | |

Fig. 13

TWO BIT ERROR CALIBRATION DEVICE FOR 256 BIT TRANSFER AND THE METHOD FOR PERFORMING THE SAME

FIELD OF THE INVENTION

The present invention relates to error correction in data transfer, and in particular to a two bit error calibration device for 256 bit transfer and the device for performing the same

BACKGROUND OF THE INVENTION

ECC (Error-correcting code) is a technology for data error checking and correction in data transmission. As comparing with parity checking, ECC uses less data for data checking and corrections. For example, for a data of 256 bits, it only uses 32 bit ECC check for data checking. When the amount of bits to be transferred is increased to be two times of the original bits, it only needs to increase one bit by using ECC checking. The ECC can allow the data error in data transmission and the data can be corrected so that the whole system can be operated normally.

In the prior art ECC technology, one bit error can be detected, but for two bits error, the system cannot correct and thus the stability of the system is affected.

In the present invention, checksum means an operation, in that an original bit string is divided into two halves, a front half and a rear half. Firstly, a new bit string is formed by the front half to subtract the rear half and a borrow is set. The means when the result is negative, a borrow flag (a first flag) is set to 1, if the result is positive, the borrow flag is set to 0. The same operation is applied to the new bit string, but at this stage, the subtraction is performed by the rear half to subtract the front half, and thus a further new bit string is formed and a further borrow is set (a second flag). The process is repeated until the bit string is a one bit string (called as a last bit). Then a new reconstructed bit string is set. The reconstructed bit string has a same bit number as the original bit string, but has the form defined as the following:

0 0 0 . . . second-flag first-flag last bit

Then the same operation is applied to the reconstructed bit string, but at this stage, the subtraction is performed by the rear half to subtract the front half. Then, the same operation is performed, but in the second operation, the subtraction is performed by the front half to subtract the rear half. The process is repeated until bit string has only one bit which is the checksum of the original bit string.

For example, the original bit string is 11011111. It is divided into a font half 1101 and a rear half 1111. Then the operation of 1101−1111 is performed, which get a result of 1110 and a borrow 1. Then the sting 1110 is divided into a front half of 11 and a rear half 10. Then the 10−11 to get a result of 11 and a flag of 1. Finally, 1−1 is preformed to have a result of 0.

The final bit and the borrow flags are combined to has a new string of 00000110 which is divided into a front half of 0000 and a rear half of 0110. Then 0110−0000 to have a result of 0110. Then 01−10 is performed to have a result of 11. Then 1−1 is performed to have a result of 0. Therefore, the checksum of 11011111 is 0.

Another operation is a bit sum which defined as that: for two strings, the bits of the same position are summed. For example, for two strings 0110 and 1010, the first bit (addition of the last bits of the two strings) is 0+0, the second bit is 1+1 (=10), the third bit is 1+0, and the fourth bit is 0+1. The result is 10000.

The present invention proposes to provide a new method for checking and correcting two bit transmission errors for a transmission of 256 bits by using least operations so that the overall bits in transmission is least and thus the transmission quality is not affected by the checking and correction operation.

SUMMARY OF THE INVENTION

The present invention provides a method for determining two bits errors in transmission of 256 bits and the device for realization of this method. By the method and device of the present invention, the two error bits transferred bits can be determined and corrected by using least bits in operation. Therefore, the amount of data in transmission is increased with a least quantity and thus the transmission quality is not affected.

The present invention provides a two bit error calibration device for 256 bit transfer, comprising:

8 memories for data storage; each memory having 8 output ports;

one calibration chip each of which having 8 output ports;

a data bus for data transfer; the data bus including receiving ports; each receiving port connected to a corresponding output port of the memories; the data bus could receive 64 bits; the data bus further including 8 checking ports which are connected to the output ports of the checking chip; wherein when the 64 receiving ports of the data bus receive data from the output ports of the memories; the receiving operation is a four stage operation and thus totally 256 bit data is received; before data are written into the memory;

an operator connected to the data bus and the memories for calculating the checksums and bit sums for above said data of 256 bits; wherein in the operator, the 25.6 bit data is stored as 32 data sets; each data set includes 8 bits; all the 256 bits from the memories being divided into 32 data sets, in that, each data set includes 8 bits which are a $0^{th}$ bit (b0), a $1^{st}$ bit (b1), a $2^{nd}$ bit (b2), and a $3^{th}$ bit (b3); $5^{th}$ bit (b5), a $6^{th}$ bit (b6), a $7^{th}$ bit (b7), and a $8^{th}$ bit (b8); totally, there are 256 bits which are the data read by the data bus; the operator calculating a calibration bit set from the 32 data sets; before data are written into the memory, all the stored data being operated for deriving the checksums and bit sums; the results of operation being transferred to the two calibration chip; wherein the calibration bit set includes 32 calibration bits which are stored in the calibration chip; wherein the 32 calibration bits are $0^{th}$ calibration bit (cb0), $1^{th}$ calibration bit (cb1), $2^{th}$ calibration bit (cb2), $3^{th}$ calibration bit (cb3), $4^{th}$ calibration bit (cb4), $5^{th}$ calibration bit (cb5), $6^{th}$ calibration bit (cb6), $7^{th}$ calibration bit (cb7), $8^{th}$ calibration bit (cb8), $9^{th}$ calibration bit (cb9), $10^{th}$ calibration bit (cb10), $11^{th}$ calibration bit (cb11), $12^{th}$ calibration bit (cb12), $13^{th}$ calibration bit (cb13), $14^{th}$ calibration bit (cb14), $15^{th}$ calibration bit (cb15), $16^{th}$ calibration bit (cb16), $17^{th}$ calibration bit cb17, $18^{th}$ calibration bit cb18, $19^{th}$ calibration bit cb19, $20^{th}$ calibration bit cb20, $21^{th}$ calibration bit cb21, $22^{th}$ calibration bit cb22, $23^{th}$ calibration bit cb23, $24^{th}$ calibration bit cb24, $25^{th}$ calibration bit cb25, $26^{th}$ calibration bit cb26, $27^{th}$ calibration bit cb27, $28^{th}$ calibration bit cb28, $29^{th}$ calibration bit cb29, $30^{th}$ calibration bit cb30, and $31^{th}$ calibration bit cb31;

a receiving end receiving the data transferred from the data bus, in that, the data includes the 256 bits data originally stored in the memories and the 32 calibration bits originally stored in the calibration chip;

a comparator in the receiving end for calculating the same operations of checksums and bit sums for the received data so as to derive another calibration bit set which includes 32 calibration bits; the calibration bits derived in the comparator from 256 bits transferred to the receiving end is compared with the calibration bits transferred from the calibration bit set originally stored in the two calibration chips as so to determine which two bits of the 256 bits are deviated in transfer; and wherein the data comparator compares all the calibration bits based on the received data with all the calibration bits 91 originally stored in the calibration chips.

Furthermore the present invention A method for two bit error calibration of 256 bit transfer by using the device defined in claim 1, where the method comprises the following steps of:

before storing a data of 256 bits into the memories, the operator dividing the 256 bits of bit into 32 data bit sets with each set having 8 bits; and deriving the calibration bits cb0 to cb31; the dividing data being stored into the memories and the calibration chip;

transferring the data in the memories and the calibration chips to the data bus which receives these data from the 64 receiving ports thereof; 256 bit data being received in 4 times from the 64 receiving ports;

based on the receiving 256 bit data in the receiving end and originally stored in the memories, the comparator calculating the checksum and bit sums;

if there are two bit errors in the received 256 bit as comparing from the bits stored in the memories, the checksums and bit sums calculated by the comparator and transferred from the calibration chips will exist differences; and then the data set and the position having two bit errors being detected;

then changing the bit from 0 to 1, or from 1 to 0 will correct the bit error.

BRIEF DESCRIPTION OF THE DRAWINGS

FIG. 7 is a first table showing relation of the error calibration bits with the respect error positions in the data set.

FIG. 8 is a second table showing relation of the error calibration bits with the respect error positions in the data set.

FIG. 9 is a third table showing relation of the error calibration bits with the respect error positions in the data set.

FIG. 10 is a fourth table showing relation of the error calibration bits with the respect error positions in the data set.

FIG. 11 is a fifth table showing relation of the error calibration bits with the respect error positions in the data set.

FIG. 12 is a sixth table showing relation of the error calibration bits with the respect error positions in the data set.

FIG. 13 is a seventh table showing relation of the error calibration bits with the respect error positions in the data set.

DETAILED DESCRIPTION OF THE INVENTION

Figure 1:
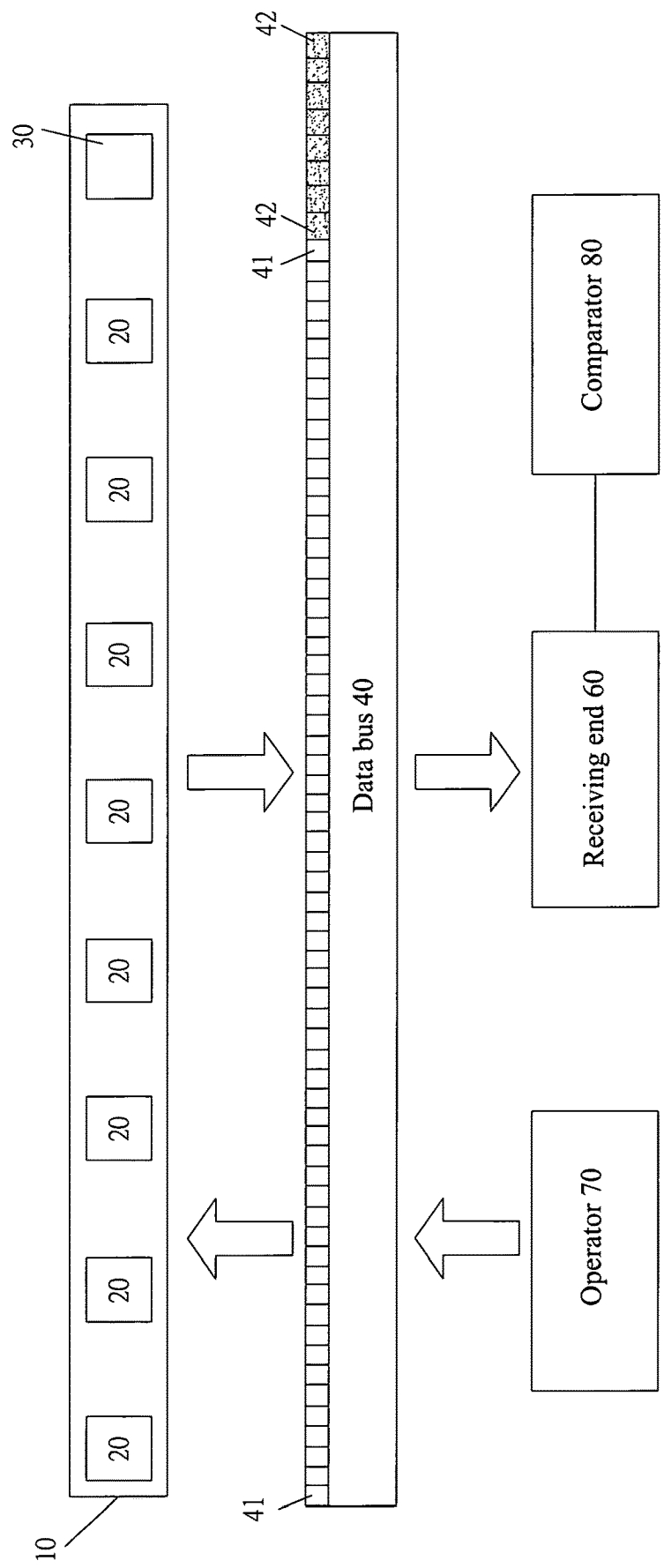
FIG. 1 is an assembly schematic view showing the elements of the present invention.

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 1 to 13, the new method for checking and correcting two bit transmission errors for a transmission of 256 bits by using least operations according to the present invention is provided. The present invention includes the following elements.

A substrate 10 is used;

8 memories 20 are arranged on the substrate 10. The memories 20 serve to store data. Each memory 20 has eight output ports 25.

a calibration chip 30 is positioned on the substrate 10. Each calibration chip 30 has eight output ports 35.

Figure 5:
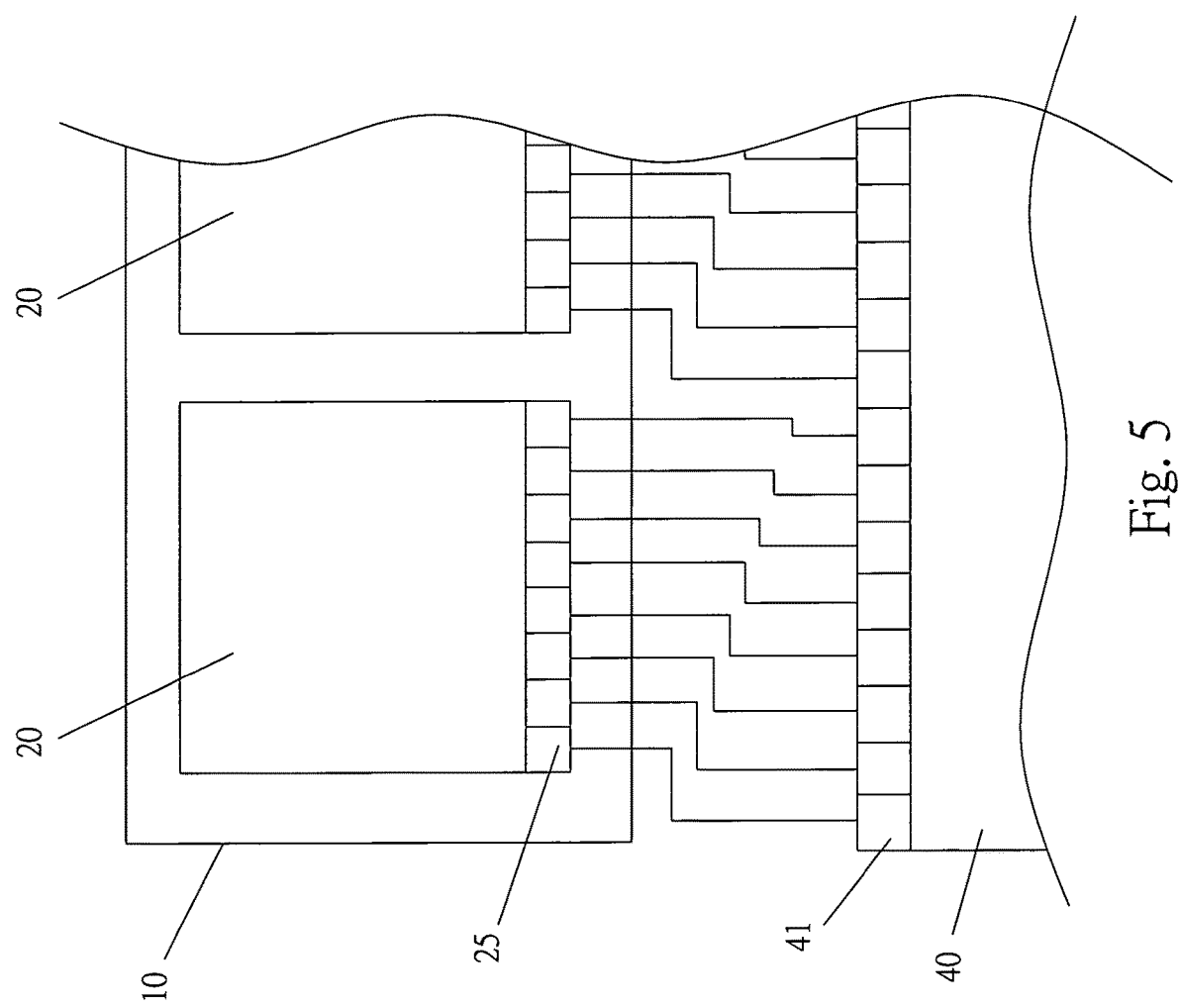
FIG. 5 is a partial schematic view showing the connection of the memories and the data bus of the present invention.

A data bus 40 serves to transfer data. The data bus 40 includes 64 receiving ports 41. Each receiving port 41 is connected to a corresponding output port 25. The data bus 40 could receive 64 bits, as illustrated in FIG. 1. The receiving ports 41 serves to be connected to the output ports 25 of the 8 memories 20, as illustrated in FIG. 5.

Figure 6:
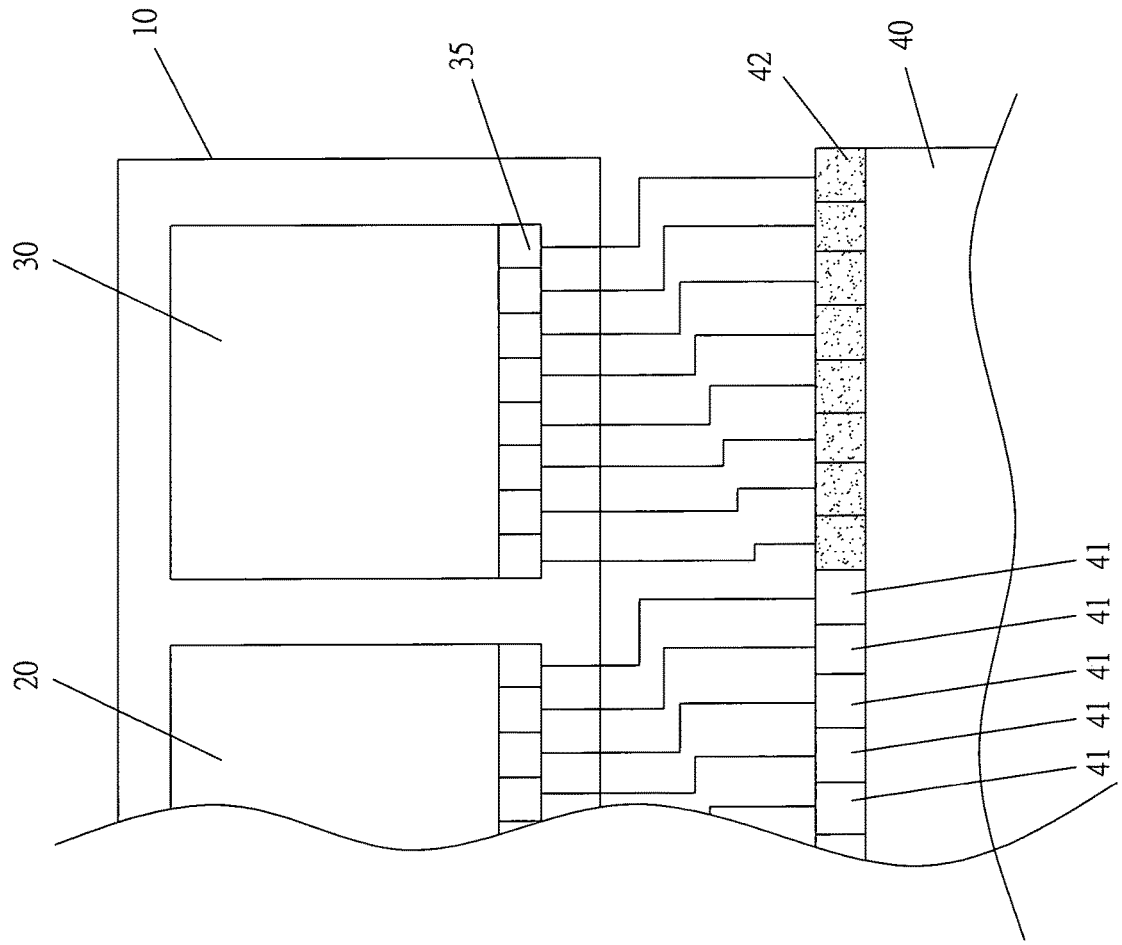
FIG. 6 is a partial schematic view showing the connection of the calibration chips and the data bus of the present invention.

Furthermore, the data bus 40 further includes 8 checking ports 42 which are connected to the output ports 35 of the two checking chips 30, as illustrated in FIG. 6.

When the 64 receiving ports 41 of the data port 40 receive data from the output ports 25 of the memories 20, the receiving operation is a four stage operation and thus totally 256 bit data is received.

Figure 2:
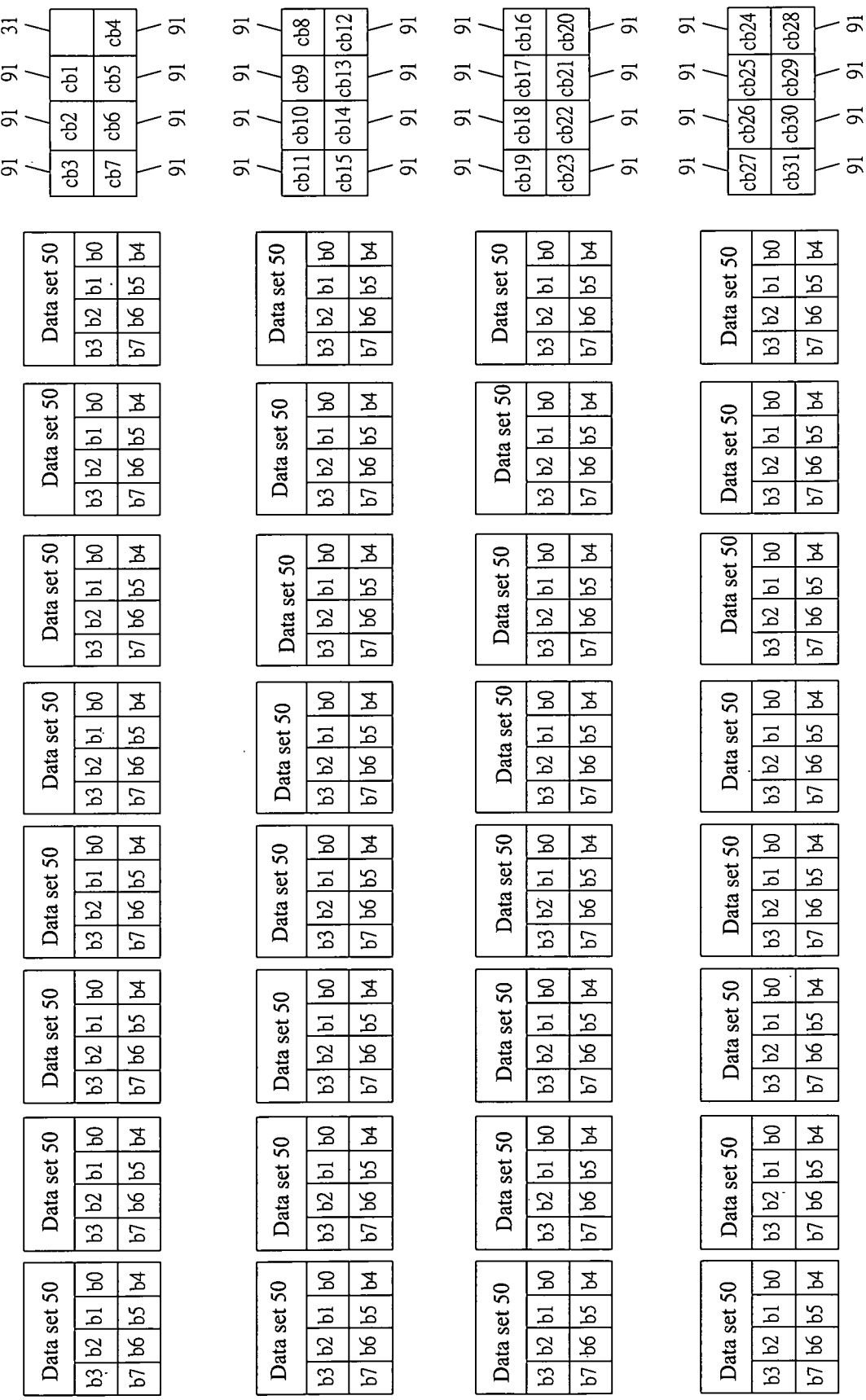
FIG. 2 is a schematic view showing the data sets and the calibration bits of the present invention.

The present invention further includes an operator 70 which is connected to the data bus 40 and the memories 20 for calculating the checksums and bit sums for above said data of 256 bits. In the operator, the 256 bit data is stored as 32 data sets 50. Each data set 50 includes eight bits. All the 256 bits from the memories 20 are divided into 32 data sets 50, which are a $0^{th}$ data set 50, a first data set 50, a second data set 50, a third data set 50, . . . , a 31 data set 50, as illustrated in FIG. 2. In that, each data set 50 includes eight bits which are a $0^{th}$ bit b0, a $1^{th}$ bit b1, a $2^{th}$ bit b2, a $4^{th}$ bit b4, a $5^{th}$ bit b5, a $6^{th}$ bit b6 and a $7^{th}$ bit 73. Totally, there are 256 bits which are the data read by the data bus 40.

The operator 70 calculates a calibration bit set 90 from the 32 data sets 50.

In the present invention, the number of substrate 10 is not limited. The number of the substrate 10 may be 1, 2, 4, and others. It only needs that the number of the output ports of the substrate 10 is corresponding to the receiving ports 41n of the data bus 40.

If there is one substrate 10, the data bus 40 has 64 receiving ports 41 and thus the data bus 40 receiving data in four stage (four times); If there is two substrates 10, the data bus 40 has 128 receiving ports 41 and thus the data bus 40 receiving data in two stage (two times); and If there is four substrates 10, the data bus 40 has 256 receiving ports 41 and thus the data bus 40 receiving data in one stage (one time). Here, a case of one substrate 10 is used as an example.

Before data are written into the memory 20, all the stored data are operated for calculation and deriving the checksums and bit sums. The results of operation are transferred to the calibration chip 30.

Figure 3:
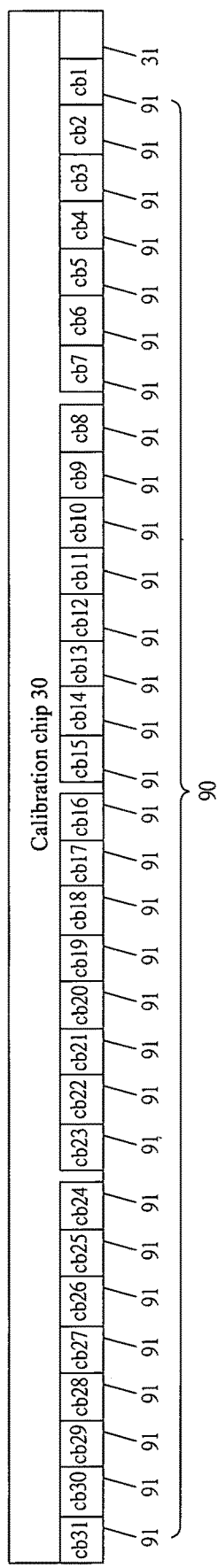
FIG. 3 is schematic view showing the calibration chips and the calibration bit sets of the present invention.

The calibration bit set 90 includes 32 calibration bits 31 (including one dull bit) which are stored in the calibration chip 30. In the 32 calibration bits 91, eight of the calibration bits 91 are assembled as one set, as illustrated in FIG. 3.

The 19 calibration bits 91 are $0^{th}$ calibration bit cb0, $1^{th}$ calibration bit cb1, $2^{th}$ calibration bit cb2, $3^{th}$ calibration bit cb3, $4^{th}$ calibration bit cb4, $5^{th}$ calibration bit cb5, $6^{th}$ calibration bit cb6, $7^{th}$ calibration bit cb7, $8^{th}$ calibration bit cb8, $9^{th}$ calibration bit cb9, $10^{th}$ calibration bit cb10, $11^{th}$ calibration bit cb11, $12^{th}$ calibration bit cb12, $13^{th}$ calibration bit cb13, $14^{th}$ calibration bit cb14, $15^{th}$ calibration bit cb15, $16^{th}$ calibration bit cb16, $17^{th}$ calibration bit cb17, $18^{th}$ calibration bit cb18, $19^{th}$ calibration bit cb19, $20^{th}$ calibration bit cb20, $21^{th}$ calibration bit cb21, $22^{th}$ calibration bit cb22, $23^{th}$ calibration bit cb23, $24^{th}$ calibration bit cb24, $25^{th}$ calibration bit cb25, $26^{th}$ calibration bit cb26, $27^{th}$ calibration bit cb27, $28^{th}$ calibration bit cb28, $29^{th}$ calibration bit cb29, $30^{th}$ calibration bit cb30, and $31^{th}$ calibration bit cb31.

In data transferring, the receiving end 60 receives the data from the data bus 40, in that, the data includes the 256 bits data originally stored in the memories 20 and the 32 calibration bits 91 originally stored in the calibration chips 30. Then a comparator 80 calculates the same operations of checksums and bit sums for the received data so as to derive another calibration bit set 90 which includes 32 calibration bits 91. The calibration bits 91 derived in the comparator 80 from 256 bits transferred to the receiving end is compared with the calibration bits 91 transferred from the calibration bit set 91 originally stored in the calibration chip 30 as so to determine which two bits of the 256 bits are deviated in transfer.

Based on the received data in the receiving end 60, the data comparator 80 calculates the $0^{th}$ calibration bit cb0, $1^{th}$ calibration bit cb1, $1^{th}$ calibration bit cb1, $2^{th}$ calibration bit cb2, $3^{th}$ calibration bit cb3, $4^{th}$ calibration bit cb4, $5^{th}$ calibration bit cb5, $6^{th}$ calibration bit cb6, and $7^{th}$ calibration bit cb7; the $8^{th}$ calibration bit cb8, the $9^{th}$ calibration bit cb9, $10^{th}$ calibration bit cb10, $11^{th}$ calibration bit cb11, $12^{th}$ calibration bit cb12, $13^{th}$ calibration bit cb13, $14^{th}$ calibration bit cb14, $15^{th}$ calibration bit cb155, $16^{th}$ calibration bit cb16, $17^{th}$ calibration bit cb17, $18^{th}$ calibration bit cb18, $19^{th}$ calibration bit cb19, $20^{th}$ calibration bit cb20, $21^{th}$ calibration bit cb21, $22^{th}$ calibration bit cb22, $23^{th}$ calibration bit cb23, $24^{th}$ calibration bit cb24, $25^{th}$ calibration bit cb25, $26^{th}$ calibration bit cb26, $27^{th}$ calibration bit cb27, $28^{th}$ calibration bit cb28, $29^{th}$ calibration bit cb29, $30^{th}$ calibration bit cb30, and $31^{th}$ calibration bit cb31 derived in the original memories 30.

Then the data comparator 80 compares all the calibration bits 91 based on the received data with all the calibration bits 91 originally stored in the calibration chips 30.

All the calibration bits 91 are defined as the following:

The $1^{th}$ calibration bit cb1=checksum of a bit string which is formed by the sequentially assembly of the $0^{th}$ bit b0 and the $4^{th}$ bits b4 of all the data sets 50.

For example, to simplify, we assume that only four data sets 50 and $0^{th}$ data set 50 is 00111101,
$1^{th}$ data set 50 is 11010001,
$2^{th}$ data set 50 is 10111010,
$3^{th}$ data set 50 is 00001011, Then the assembly of the bit stream is 01101011. Then operation of checksum is used to this bit string for getting the $0^{th}$ calibration bits cb0.

The $2^{th}$ calibration bit cb2 checksum of a bit string which is formed by the sequentially assembly of all the bits of the $0^{th}$, $4^{th}$, $8^{th}$, $12^{th}$, $16^{th}$, $20^{th}$, $24^{th}$, $28^{th}$ data sets 50.

The $3^{th}$ calibration bit cb1=checksum of a bit string which is formed by the sequentially assembly of the $1^{th}$ bit b1 and the $5^{th}$ bits b5 of all the data sets 50.

The $4^{th}$ calibration bit cb2=checksum of a bit string which is formed by the sequentially assembly of all the bits of the $2^{th}$, $6^{th}$, $10^{th}$, $14^{th}$, $18^{th}$, $22^{th}$, $26^{th}$, $30^{th}$ data sets 50.

The $5^{th}$ calibration bit cb1=checksum of a bit string which is formed by the sequentially assembly of the $2^{th}$ bit b2 and the $6^{th}$ bits b6 of all the data sets 50.

The $6^{th}$ calibration bit cb2=checksum of a bit string which is formed by the sequentially assembly of all the bits of the $1^{th}$, $5^{th}$, $9^{th}$, $13^{th}$, $17^{th}$, $21^{th}$, $25^{th}$, $29^{th}$ of all the data sets 50.

The $7^{th}$ calibration bit cb1=checksum of a bit string which is formed by the sequentially assembly of the $3^{th}$ bit b3 and the $7^{th}$. bits b7 of all the data sets 50.

The $8^{th}$ calibration bit cb2=checksum of a bit string which is formed by the sequentially assembly of all the bits of the $3^{th}$, $7^{th}$, $11^{th}$, $15^{th}$, $19^{th}$, $23^{th}$, $27^{th}$, $31^{th}$ data sets 50.

The $9^{th}$ calibration bit cb1=checksum of a bit string which is formed by the sequentially assembly of the $0^{th}$ bit b0 to the $3^{th}$ bits b3 of $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets 50.

The $10^{th}$ calibration bit cb1=checksum of a bit string which is formed by the sequentially assembly of the $4^{th}$ bit b4 to the $7^{th}$ bits 7 of $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets 50.

The $11^{th}$ calibration bit cb11=checksum of all the bits of the $0^{th}$, $1^{th}$, $2^{th}$, $3^{th}$, $4^{th}$, $5^{th}$, $6^{th}$, $7^{th}$ data sets 50.

The $12^{th}$ calibration bit cb12=checksum of all the bits of the $8^{th}$, $9^{th}$, $10^{th}$, $11^{th}$, $12^{th}$, $13^{th}$, $14^{th}$, $15^{th}$ data sets 50.

The $13^{th}$ calibration bit cb13=checksum of all the bits of the $16^{th}$, $17^{th}$, $18^{th}$, $19^{th}$, $20^{th}$, $21^{th}$, $22^{th}$, $23^{th}$ data sets 50.

The $14^{th}$ calibration bit cb14=checksum of all the bits of the $24^{th}$, $25^{th}$, $26^{th}$, $27^{th}$, $28^{th}$, $29^{th}$, $30^{th}$, $31^{th}$ data sets 50.

The $15^{th}$ calibration bit cb15=checksum of a bit string which is formed by the sequentially assembly of $0^{th}$ bit b0 to the $3^{th}$ bit b3 of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets 50.

The $16^{th}$ calibration bit cb16=checksum of a bit string which is formed by the sequentially assembly of $4^{th}$ bit b4 and the $7^{th}$ bit b7 of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets 50.

The $17^{th}$ calibration bit cb17=checksum of a bit string which is formed by the sequentially assembly of $0^{th}$ bit b0, the $1^{th}$ bit b1, the $4^{th}$ bit b4 and the $5^{th}$ bit b5 of the $0^{th}$, $1^{th}$, $4^{th}$, $5^{th}$, $8^{th}$, $9^{th}$, $12^{th}$, $13^{th}$, $16^{th}$, $17^{th}$, $20^{th}$, $21^{th}$, $24^{th}$, $25^{th}$, $28^{th}$, $29^{th}$ data sets 50.

The $18^{th}$ calibration bit cb18=checksum of a bit string which is formed by the sequentially assembly of $0^{th}$ bit b0, the $2^{th}$ bit b2, the $4^{th}$ bit b4 and the $6^{th}$ bit b6 of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$ data sets 50.

The $19^{th}$ calibration bit cb19=checksum of a bit string which is formed by the sequentially assembly of the $0^{th}$ bit b0 to the $3^{th}$ bit b3 of the $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets 50.

The $20^{th}$ calibration bit cb20=checksum of a bit string which is formed by the sequentially assembly of the $0^{th}$ bit b0, the $2^{nd}$ bit b2, the $4^{th}$ bit b4 and the $6^{th}$ bit b6 of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets 50.

The 21$^{th}$ calibration bit cb21=checksum of a bit string which is formed by the sequentially assembly of the 2$^{th}$ bit b2, the 3$^{rd}$ bit b3, the 6$^{th}$ bit b6 and the 7$^{th}$ bit b7 of the 0$^{th}$, 2$^{th}$, 4$^{th}$, 6$^{th}$, 8$^{th}$, 10$^{th}$, 12$^{th}$, 14$^{th}$, 16$^{th}$, 18$^{th}$, 20$^{th}$, 22$^{th}$, 24$^{th}$, 26$^{th}$, 28$^{th}$, 30$^{th}$ data sets 50.

The 22$^{th}$ calibration bit cb22=checksum of a bit string which is formed by the sequentially assembly of the 0$^{th}$ bit b0 to the 3$^{th}$ bit b3 of the 8$^{th}$, 9$^{th}$, 10$^{th}$, 11$^{th}$, 12$^{th}$, 12$^{th}$, 13$^{th}$, 14$^{th}$, 15$^{th}$, 24$^{th}$, 25$^{th}$, 26$^{th}$, 27$^{th}$, 28$^{th}$, 29$^{th}$, 30$^{th}$, 31$^{th}$ data sets 50.

The 23$^{th}$ calibration bit cb23=checksum of a bit string which is formed by the sequentially assembly of all the bits 16$^{th}$, 17$^{th}$, 18$^{th}$, 19$^{th}$, 24$^{th}$, 25$^{th}$, 26$^{th}$, 27$^{th}$ data sets 50.

The 24$^{th}$ calibration bit cb24=bit sum of a bit string which is formed by the sequentially assembly of all the bits of all the data sets 50.

The 25$^{th}$ calibration bit cb25=bit sum of a bit string which is formed by the sequentially assembly of all the bits of all the data sets 50.

The 26$^{th}$ calibration bit cb26=bit sum of a bit string which is formed by the sequentially assembly of all the bits of all the data sets 50.

The 27$^{th}$ calibration bit cb27=bit sum of a bit string which is formed by the sequentially assembly of all the bits of all the data sets 50.

The 28$^{th}$ calibration bit cb28=bit sum of a bit string which is formed by the sequentially assembly of all the bits of all the data sets 50.

The 29$^{th}$ calibration bit cb29=bit sum of a bit string which is formed by the sequentially assembly of all the bits of all the data sets 50.

The 30$^{th}$ calibration bit cb30=bit sum of a bit string which is formed by the sequentially assembly of all the bits of all the data sets 50.

The 31$^{th}$ calibration bit cb31=bit sum of a bit string which is formed by the sequentially assembly of all the bits of all the data sets 50.

In above, the 1$^{st}$ to 23$^{th}$ calibration bits cb1 to cb23 are checksums and the 24$^{th}$ to 31$^{th}$ calibration bits cb1 to cb23 are bit sums In above, there are nine calibration bits 91 are checksums of all bits of predetermined data sets 50, which are the 2$^{th}$ calibration bit cb2, the 2$^{th}$ calibration bit cb2, the 4$^{th}$ calibration bit cb4, the 6$^{th}$ calibration bit cb6, the 8$^{th}$ calibration bit cb8, the 11$^{th}$ calibration bit cb11, the 12$^{th}$ calibration bit cb12, the 13$^{th}$ calibration bit cb13, the 14$^{th}$ calibration bit cb14, and the 23$^{th}$ calibration bit cb23. These nine calibration bits serve to determine the two or one data sets 50 including two error transfer bits In determination of the two data sets 50 or one data set 50 containing the two error transferred bits, that is, two bits which are incorrect as compared with the bits originally transferred from the memories 20. All the nine calibration bits cb2, cb4, cb6, cb8, cb11, cb12, cb13, cb14, cb23 can be used, or only parts of the nine calibration bits cb2, cb4, cb6, cb8, cb11, cb12, cb13, cb14, cb23 are used.

The calibration bits the 1$^{th}$ calibration bit cb1, the 3$^{th}$ calibration bit cb3, the 5$^{th}$ calibration bit cb5, the 7$^{th}$ calibration bit cb7, the 9$^{th}$ calibration bit cb9, the 10$^{th}$ calibration bit cb10, the 15$^{th}$ calibration bit cb15, the 16$^{th}$ calibration bit cb16, the 17$^{th}$ calibration bit cb17, and the 18$^{th}$ calibration bit cb18; the 19$^{th}$ calibration bit cb19, the 20$^{th}$ calibration bit cb20, the 21$^{th}$ calibration bit cb21, the 22$^{th}$ calibration bit cb22, the 24$^{th}$ calibration bit cb24, the 25$^{th}$ calibration bit cb25, the 26$^{th}$ calibration bit cb26, the 27$^{th}$ calibration bit cb27, the 28$^{th}$ calibration bit cb28, the 29$^{th}$ calibration bit cb29, the 30$^{th}$ calibration bit cb30, and the 31$^{th}$ calibration bit cb31. These 22 calibration bits are used to determine positions of the two data sets 50 or in the same one data set 50 in which the two error transferred bits exist. It is possibly that the two error transferred bits are existed at two different data sets 50 or at the same data set 50. All the 22 calibration bits can be used, or parts of the 22 calibration bits are used.

The table shown in FIGS. 7 to 13 shows if the errors occur at two different calibration bits 91, the corresponding positions of the error transferred bits in the corresponding data sets 50.

For example, referring to the first line of FIG. 7, in the comparison of the transferred calibration bits calculated from the transferred data in the receiving end 60 and the original calibration bits calculated from the data originally stored in the memory 20 by the comparator 80, it finds that the transferred calibration bit cb0 is different from the original calibration bit cb0 and the transferred calibration bit cb4 is different from the original calibration bit cb4, it can conclude that the error transferred data are at 0$^{th}$ bit in the 0$^{th}$ data set 50 and the 1$^{th}$ bit in the 0$^{th}$ data set 50.

If there is one bit error in the received 256 bit, it will be different on the checksums and bit sums. From the table shown in FIGS. 7 to 13, the data set 50 and the position having the bit errors will be detected. Then changing the bit front 0 to 1, or front 1 to 0 will correct the bit error.

In FIGS. 7 to 13, the 2$^{nd}$ calibration bit cb2, the 4$^{th}$ calibration bit cb4, the 6$^{th}$ calibration bit cb6, the 8$^{th}$ calibration bit cb8 are used to determine which two or one of the data sets 50 having the two error bits. The 1$^{st}$ calibration bit cb1, the 3$^{th}$ calibration bit cb3, the 5$^{th}$ calibration bit cb5, the 7$^{th}$ calibration bit cb7; The 17$^{th}$ calibration bit cb17, the 18$^{th}$ calibration bit cb18, the 19$^{th}$ calibration bit cb19, the 20$^{th}$ calibration bit cb20, and 21$^{th}$ calibration bit 21 are used to determine the positions of the two error bits in the two or one data set 50. The X in the table means that the comparison result shows that calibration bits 91 in the comparison are different; and the space in the table means that the comparison result shows that the calibration bits 91 in the comparison are identical. The last two lattices in Figures shows the positions and the data sets (or data set) having the error transferring bits. For some cases, the positions cannot be found. Then other calibration bits are used for determining which two or one of the data sets 50 having the two error bits.

Figure 4:
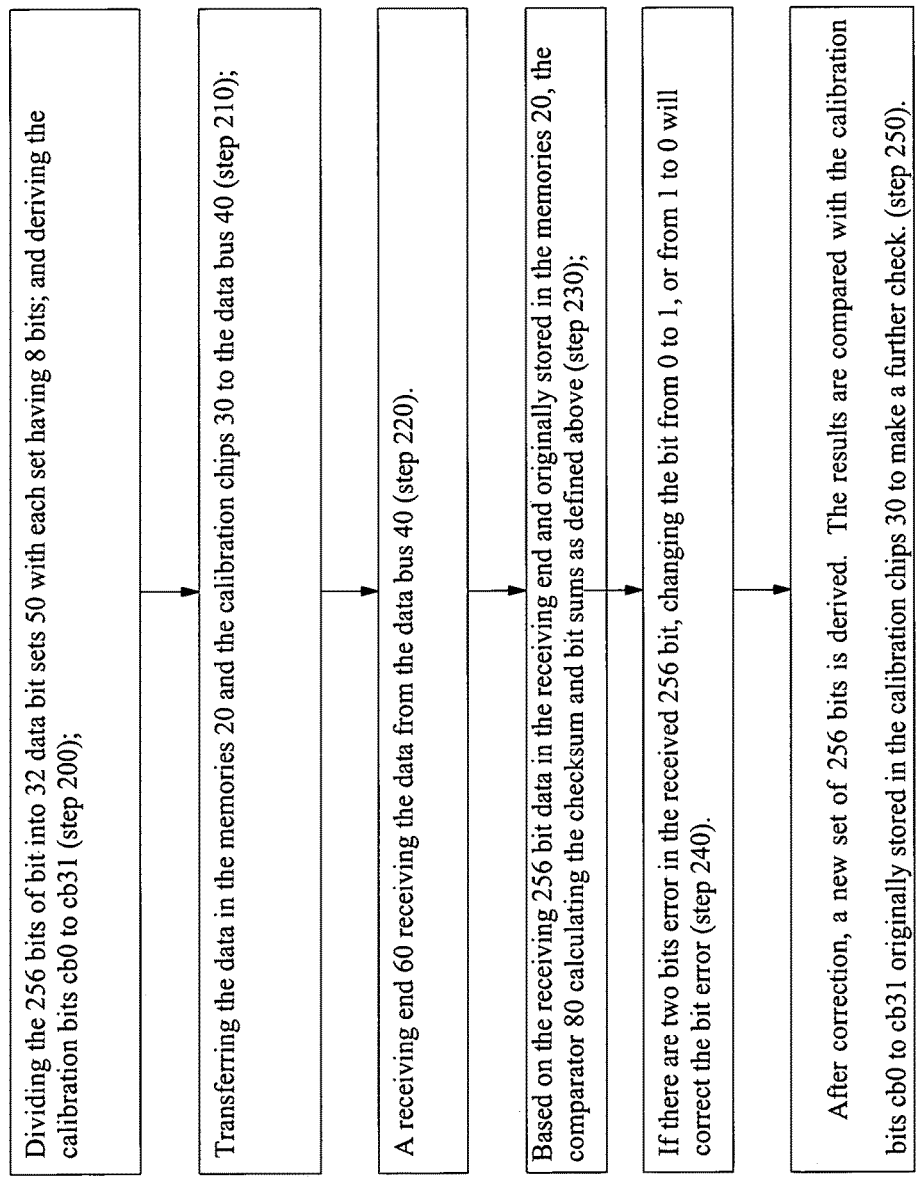
FIG. 4 shows the operation flow diagram of the present invention.

FIG. 4 shows the method for error correction by using above mentioned device. The method includes the following step of:

Before storing a data of 256 bits into the memories 30, the operator 70 dividing the 256 bits of bit into 32 data bit sets 50 with each set having 8 bits; and deriving the calibration bits cb0 to cb31 as defined above; the ways for arranging these data as described above. The dividing data being stored into the memories 20 and the calibration chips 30 (step 200);

Transferring the data in the memories 20 and the calibration chips 30 to the data bus 40 which receives these data from the 64 receiving ports 41 thereof through four stages; 256 bit data being received in four times from the 64 receiving ports 41 (step 210);

A receiving end 60 receiving the data from the data bus 40 (step 220).

Based on the receiving 256 bit data in the receiving end and originally stored in the memories 20, The comparator 80 calculating the checksum and bit sums as defined above (step 230);

If there are two bits error in the received 256 bit as comparing from the bits stored in the memories 20, the checksums and bit sums calculated by the comparator 80 and transferred from the calibration chips 30 will exist differences. Furthermore, from the table shown in FIGS. 7 to 11, the data set 50 and the positions having the bit error are got. Then changing the bit from 0 to 1, or from 1 to 0 will correct the bit error (step 240).

After correction, a new set of 256 bits is derived, the comparator 80 calculates the calibration bits cb0 to cb31 as described above for the corrected new 256 bits. The results are compared with the calibration bits cb0 to cb31 originally stored in the calibration chips 30. If all the calibration bits are identical, it means that the corrections are correct. If some calibration bits are different, it means that the numbers of the error bits in transfer are greater than 2 (step 250).

In use of the present invention, firstly, to check whether there is a one bit error in transmission of the 256 bits by the method for checking the one bit error (which is known in the prior art). If the error is not a one bit error, than the method of the present invention is used to check whether the transmission error is two bits. Above mentioned method of the present invention can be used to determine two bit errors. Furthermore, the present invention further provides a method to determine whether the number of error bits are greater than two. If it is not greater than two and not one, then the method of the present invention provides a method to correct the two bit errors in transmission.

The present invention provides a method for determining two bits errors in transmission of 256 bits and the device for realization of this method. By the method and device of the present invention, the two error bits transferred bits can be determined and corrected by using least bits in operation. Therefore, the amount of data in transmission is increased with a least quantity and thus the transmission quality is not affected.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A two bit error calibration device for 256 bit transfer, comprising:
    8 memories for data storage; each memory having 8 output ports;
    one calibration chip having 8 output ports;
    a data bus for data transfer; the data bus including 64 receiving ports; each receiving port connected to a corresponding output port of the 8 memories; the data bus could receive 64 bits; the data bus further including 8 checking ports which are connected to the 8 output ports of the calibration chip; wherein when the 64 receiving ports of the data bus receive data from the 8 output ports of the 8 memories; the 256 bit transfer is a four stage operation and thus the 25.6 bit data are received; before data are written into the memory;
    an operator connected to the data bus and the 8 memories for calculating checksums and bit sums for the 256 bit data; wherein in the operator, the 256 bit data is stored as 32 data sets; each data set of the 32 data sets includes 8 bits; all the 256 bit data from the 8 memories being divided into 32 data sets, in that, each data set includes 8 bits which are a $0^{th}$ bit (b0), a $1^{st}$ bit (b1), a $2^{nd}$ bit (b2), and a $3^{th}$ bit (b3); $5^{th}$ bit (b5), a $6^{th}$ bit (b6), a $7^{th}$ bit (b7), and a $8^{th}$ bit (b8); totally, there are 256 bit data which are read by the data bus; the operator calculating a calibration bit set from the 32 data sets; before data are written into the memory, all the stored data being operated for deriving the checksums and bit sums; results of the deriving the checksums and bit sums being transferred to two calibration chips; wherein the calibration bit set includes 32 calibration bits which are stored in each of the calibration chips; wherein the 32 calibration bits are $0^{th}$ calibration bit (cb0), calibration bit (cb1), $2^{th}$ calibration bit (cb2), $3^{th}$ calibration bit (cb3), $4^{th}$ calibration bit (cb4), $5^{th}$ calibration bit (cb5), $6^{th}$ calibration bit (cb6), $7^{th}$ calibration bit (cb7), $8^{th}$ calibration bit (cb8), $9^{th}$ calibration bit (cb9), $10^{th}$ calibration bit (cb10), $11^{th}$ calibration bit (cb11), $12^{th}$ calibration bit (cb12), $13^{th}$ calibration bit (cb13), $14^{th}$ calibration bit (cb14), $15^{th}$ calibration bit (cb15), $16^{th}$ calibration bit (cb16), $17^{th}$ calibration bit (cb17), $18^{th}$ calibration bit (cb18), $19^{th}$ calibration bit (cb19), $20^{th}$ calibration bit (cb20), $21^{th}$ calibration bit (cb21), $22^{th}$ calibration bit (cb22), $23^{th}$ calibration bit (cb23), $24^{th}$ calibration bit (cb24), $25^{th}$ calibration bit (cb25), $26^{th}$ calibration bit (cb26), $27^{th}$ calibration bit (cb27), $28^{th}$ calibration bit (cb28), $29^{th}$ calibration bit (cb29), $30^{th}$ calibration bit (cb30), and $31^{th}$ calibration bit (cb31);
    a receiving end receiving the data transferred from the data bus, in that, the data includes the 256 bits data originally stored in the 8 memories and the 32 calibration bits originally stored in the calibration chip;
    a comparator in the receiving end for calculating the checksums and bit sums for the received data so as to derive another calibration bit set which includes 32 calibration bits; the calibration bits derived in the comparator from 256 bits transferred to the receiving end is compared with the calibration bits transferred from the calibration bit set originally stored in the two calibration chips as so to determine which two bits of the 256 bits are deviated in transfer; and
    wherein the comparator compares all the calibration bits based on the received data with all the calibration bits originally stored in the calibration chips.

2. The two bit error calibration device for 256 bit transfer as claimed in claim 1, wherein the 32 calibration bits include nine calibration bits for determining two data sets or one data set having two error transferred bits.

3. The two bit error calibration device for 256 bit transfer as claimed in claim 2, wherein the 32 calibration bits include 22 calibration bits for determining positions in the two data sets having two error transferred bits, respectively, or determining positions in the one data set having two error transferred bits.

4. The two bit error calibration device for 256 bit transfer as claimed in claim 2, wherein the nine calibration bits are:
    the $2^{th}$ calibration bit (cb2)=checksum of a bit string which is formed by sequential assembly of all the bits of the $0^{th}$, $4^{th}$, $8^{th}$, $12^{th}$, $16^{th}$, $20^{th}$, $24^{th}$, $28^{th}$ data sets;
    the $4^{th}$ calibration bit (cb4)=checksum of a bit string which is formed by sequential assembly of all the bits of the $2^{th}$, $6^{th}$, $10^{th}$, $14^{th}$, $18^{th}$, $22^{th}$, $26^{th}$, $30^{th}$ data sets;
    the $6^{th}$ calibration bit (cb6)=checksum of a bit string which is formed by sequential assembly of all the bits of the $1^{th}$, $5^{th}$, $9^{th}$, $13^{th}$, $17^{th}$, $21^{th}$, $25^{th}$, $29^{th}$ of all the data sets;
    the $8^{th}$ calibration bit (cb8)=checksum of a bit string which is formed by sequential assembly of all the bits of the $3^{th}$, $7^{th}$, $11^{th}$, $15^{th}$, $19^{th}$, $23^{th}$, $27^{th}$, $31^{th}$ data sets;
    the $11^{th}$ calibration bit (cb11)=checksum of all the bits of the $0^{th}$, $1^{th}$, $2^{th}$, $3^{th}$, $4^{th}$, $5^{th}$, $6^{th}$, $7^{th}$, data sets;
    the $12^{th}$ calibration bit (cb12)=checksum of all the bits of the $8^{th}$, $9^{th}$, $11^{th}$, $12^{th}$, 13, $14^{th}$, $15^{th}$ data sets;

the 13$^{th}$ calibration bit (cb13)=checksum of all the bits of the 16$^{th}$, 17$^{th}$, 18$^{th}$, 19$^{th}$, 20$^{th}$, 21$^{th}$, 22$^{th}$, 23$^{th}$ data sets;
the 14$^{th}$ calibration bit (cb14)=checksum of all the bits of the 24$^{th}$, 25$^{th}$, 26$^{th}$, 27$^{th}$, 28$^{th}$, 29$^{th}$, 30$^{th}$, 31$^{th}$ data sets;
the 23$^{th}$ calibration bit (cb23)=checksum of a bit string which is formed by sequential the sequentially assembly of all the bits 16$^{th}$, 17$^{th}$, 19$^{th}$, 18$^{th}$, 24$^{th}$, 25$^{th}$, 26$^{th}$, 27$^{th}$ data sets.

5. The two bit error calibration device for 256 bit transfer as claimed in claim 3, wherein the 22 calibration bits are:
the 1$^{th}$ calibration bit (cb1)=checksum of a bit string which is formed by sequential the sequentially assembly of the 0$^{th}$ bit (b0) and the 4$^{th}$ bits (b4) of all data sets;
the 3$^{th}$ calibration bit (cb3)=checksum of a bit string which is formed by sequential assembly of the 1$^{th}$ bit (b1) and the 5$^{th}$ bits (b5) of all the data sets;
the 5$^{th}$ calibration bit (cb5)=checksum of a bit string which is formed by sequential assembly of the 2$^{th}$ bit (b2) and the 6$^{th}$ bits (b6) of all the data sets;
the 7$^{th}$ calibration bit (cb7)=checksum of a bit string which is formed by sequential the sequentially assembly of the 3$^{th}$ bit (b3) and the 7$^{th}$ bits (b7) of all the data sets;
the 9$^{th}$ calibration bit (cb9)=checksum of a bit string which is formed by sequential assembly of the 0$^{th}$ bit (b0) to the 3$^{th}$ bits (b3) of 0$^{th}$, 1$^{th}$, 2$^{th}$, 3$^{th}$, 8$^{th}$, 9$^{th}$, 10$^{th}$, 11$^{th}$, 16$^{th}$, 17$^{th}$, 18$^{th}$, 19$^{th}$, 24$^{th}$, 25$^{th}$, 26$^{th}$, 27$^{th}$ data sets;
the 10$^{th}$ calibration bit (cb10)=checksum of a bit string which is formed by sequential assembly of the 4$^{th}$ bit (b4) to the 7$^{th}$ bits (b7) of 0$^{th}$, 1$^{th}$, 2$^{th}$, 3$^{th}$, 8$^{th}$, 9$^{th}$, 10$^{th}$, 11$^{th}$, 16$^{th}$, 17$^{th}$, 18$^{th}$, 19$^{th}$, 24$^{th}$, 25$^{th}$, 26$^{th}$, 27$^{th}$ data sets;
the 15$^{th}$ calibration bit (cb15)=checksum of a bit string which is formed by sequential assembly of 0$^{th}$ bit (b0) to the 3$^{th}$ bit (b3) b3 of the 4$^{th}$, 5$^{th}$, 6$^{th}$, 7$^{th}$, 12$^{th}$, 13$^{th}$, 14$^{th}$, 15$^{th}$, 20$^{th}$, 21$^{th}$, 22$^{th}$, 23$^{th}$, 28$^{th}$, 29$^{th}$, 30$^{th}$, 31$^{th}$, data sets;
the 16$^{th}$ calibration bit (cb16) a checksum of a bit string which is formed by sequential, the sequentially assembly of 4$^{th}$ bit (b4) and the 7$^{th}$ bit (b7) of the 4$^{th}$, 5$^{th}$, 6$^{th}$, 7$^{th}$, 12$^{th}$, 13$^{th}$, 14$^{th}$, 15$^{th}$, 20$^{th}$, 21$^{th}$, 22$^{th}$, 23$^{th}$, 28$^{th}$, 29$^{th}$, 30$^{th}$, 31$^{th}$, data sets;
the 17$^{th}$ calibration bit (cb17)=checksum of a bit string which is formed by sequential assembly of 0$^{th}$ bit (b0), the 1$^{th}$ bit (b1), the 4$^{th}$ bit (b4) b4 and the 5$^{th}$ bit (b5) of the 0$^{th}$, 1$^{th}$, 4$^{th}$, 5$^{th}$, 8$^{th}$, 9$^{th}$, 12$^{th}$, 13$^{th}$, 16$^{th}$, 17$^{th}$, 20$^{th}$, 21$^{th}$, 24$^{th}$, 25$^{th}$, 28$^{th}$, 29$^{th}$ data sets;
the 18$^{th}$ calibration bit (cb18)=checksum of a bit string which is formed by sequential assembly of 0$^{th}$ bit (b0), the 2$^{th}$ bit (b2), the 4$^{th}$ bit (b4) and the 6$^{th}$ bit (b6) of the 0$^{th}$, 2$^{th}$, 4$^{th}$, 6$^{th}$, 8$^{th}$, 10$^{th}$, 12$^{th}$, 14$^{th}$, 16$^{th}$, 18$^{th}$, 20$^{th}$, 22$^{th}$, 24$^{th}$, 26$^{th}$, 28$^{th}$, 30$^{th}$ data sets;
the 19$^{th}$ calibration bit (b19)=checksum of a bit string which is formed by sequential the sequentially assembly of the 0$^{th}$ bit (b0) to the 3$^{th}$ bit (b3) of the 0$^{th}$, 1$^{th}$, 2$^{th}$, 3$^{th}$, 8$^{th}$, 9$^{th}$, 10$^{th}$, 11$^{th}$, 16$^{th}$, 17$^{th}$, 18$^{th}$, 19$^{th}$, 24$^{th}$, 25$^{th}$, 26$^{th}$, 27$^{th}$ data sets;
the 20$^{th}$ calibration bit (cb20)=checksum of a bit string which is formed by sequential assembly of the 0$^{th}$ bit (b0), the 2$^{nd}$ bit (b2), the 4$^{th}$ bit (b4) and the 6$^{th}$ bit (b6) of the 2$^{th}$, 3$^{th}$, 6$^{th}$, 7$^{th}$, 10$^{th}$, 11$^{th}$, 14$^{th}$, 15$^{th}$, 18$^{th}$, 19$^{th}$, 22$^{th}$, 23$^{th}$, 26$^{th}$, 27$^{th}$, 30$^{th}$, 31$^{th}$ data sets;
the 21$^{th}$ calibration bit (cb21)=checksum of a bit string which is formed by sequential assembly of the 2$^{th}$ bit (b2), the 3$^{rd}$ bit (b3), the 6$^{th}$ bit (b6) and the 7$^{th}$ bit (b7) of the 0$^{th}$, 2$^{th}$, 4$^{th}$, 6$^{th}$, 8$^{th}$, 10$^{th}$, 12$^{th}$, 14$^{th}$ 16$^{th}$, 18$^{th}$, 20$^{th}$, 22$^{th}$, 24$^{th}$, 26$^{th}$, 28$^{th}$, 30$^{th}$ data sets;
the 22$^{th}$ calibration bit (cb22)=checksum of a bit string which is formed by sequential assembly of the 0$^{th}$ bit (b0) to the 3$^{th}$ bit (b3) of the 8$^{th}$, 9$^{th}$, 10$^{th}$, 11$^{th}$, 12$^{th}$, 13$^{th}$, 14$^{th}$, 15$^{th}$, 24$^{th}$, 25$^{th}$, 26$^{th}$, 27$^{th}$, 28$^{th}$, 29$^{th}$, 30$^{th}$, 31$^{th}$ data sets;
the 24$^{th}$ calibration bit (cb24)=bit sum of a bit string which is formed by sequential assembly of all the bits of all the data sets;
the 25$^{th}$ calibration bit (cb25)=bit sum of a bit string which is formed by sequential assembly of all the bits of all the data sets;
the 26$^{th}$ calibration bit (cb26)=bit sum of a bit string which is formed by sequential assembly of all the bits of all the data sets;
the 27$^{th}$ calibration bit (cb27)=bit sum of a bit string which is formed by sequential assembly of all the bits of all the data sets;
the 28$^{th}$ calibration bit (cb28)=bit sum of a bit string which is formed by sequential, assembly of all the bits of all the data sets;
the 29$^{th}$ calibration bit (cb29)=bit sum of a bit string which is formed by sequential assembly of all the bits of all the data sets;
the 30$^{th}$ calibration bit (cb30)=bit sum of a bit string which is formed by sequential assembly of all the bits of all the data sets;
the 31$^{th}$ calibration bit (cb31)=bit sum of a bit string which is formed by sequential assembly of all the bits of all the data sets.

6. The two bit error calibration device for 256 bit transfer as claimed in claim 4, wherein the 2$^{nd}$ calibration bit (cb2); the 4$^{th}$ calibration bit (cb4); the 6$^{th}$ calibration bit (cb6); the 8$^{th}$ calibration bit (cb8) data sets are used to determine the two or one data set including the error transfer bits.

7. The two bit error calibration device for 256 bit transfer as claimed in claim 5, wherein the 1$^{st}$ calibration bit (eta); the 3$^{th}$ calibration, bit (cb3); the 5$^{th}$ calibration bit (cb5); the 7$^{th}$ calibration bit (cb7); the 17$^{th}$ calibration bit (cb17); the 18$^{th}$ calibration bit (cb18); the 19$^{th}$ calibration bit (cb19); the 20$^{th}$ calibration bit (cb20); the 21$^{th}$ calibration bit (cb21) data sets are use to determine that positions of two data sets have the two error bits or positions of one data set have the two error bits.

8. A method for two bit error calibration of 256 bit transfer by using the device defined in claim 1, where the method comprises the following steps of:
before storing a data of 256 bits into the 8 memories, the operator dividing the 256 bits of bit into 32 data bit sets with each set having 8 bits;
and deriving the calibration bits (ob0) to (cb31); the dividing data being stored into the 8 memories and the calibration chip;
transferring the data in the 8 memories and the calibration chips to the data bus which receives these data from the 64 receiving ports thereof; 256 bit data being received in 4 times from the 64 receiving ports;
based on the receiving 256 bit data in the receiving end and originally stored in the 8 memories, the comparator calculating the checksum and bit sums;
if there are two bit errors in the received 256 bit as comparing from the bits stored in the 8 memories, the checksums and bit sums calculated from by the comparator and transferred from the calibration chips will exist differences; and then the data set and the position having two bit errors being detected; then changing the bit from 0 to 1, or from 1 to 0 will correct the bit error.

9. The method as claimed in claim 8, wherein the 31 calibration bits include nine calibration bits for determining two data sets having two error transferred bits.

10. The method as claimed in claim 9, wherein the 31 calibration bits include 22 calibration bits for determining positions of the two data sets having two error transferred bits, respectively or determining positions of the one data set having two error transferred bits.

11. The method as claimed in claim 9, wherein the nine calibration bits are:
   the $2^{th}$ calibration bit (cb2) cb2=checksum of a bit string which is formed by sequential assembly of all the bits of the $0^{th}$, $4^{th}$, $8^{th}$, $12^{th}$, $16^{th}$, $20^{th}$, $24^{th}$, $28^{th}$ data sets;
   the $4^{th}$ calibration bit (cb4)=checksum of a bit string which is formed by sequential assembly of all the bits of the $2^{th}$, $6^{th}$, $10^{th}$, $14^{th}$, $18^{th}$, $22^{th}$, $26^{th}$, $30^{th}$ data sets;
   the $6^{th}$ calibration bit (cb6)=checksum of a bit string which is formed by sequential assembly of all the bits of the $1^{th}$, $5^{th}$, $9^{th}$, $13^{th}$, $17^{th}$, $21^{th}$, $25^{th}$, $29^{th}$ of all the data sets;
   the $8^{th}$ calibration bit (cb8)=checksum of a bit string which is formed by sequential assembly of all the bits of the $3^{th}$, $7^{th}$, $11^{th}$, $15^{th}$, $19^{th}$, $23^{th}$, $27^{th}$, $31^{th}$ data sets;
   the $11^{th}$ calibration bit (cb11)=checksum of all the bits of the $0^{th}$, $1^{th}$, $2^{th}$, $3^{th}$, $4^{th}$, $5^{th}$, $6^{th}$, $7^{th}$ data sets;
   the $12^{th}$ calibration bit (cb12)=checksum of all the bits of the $8^{th}$, $9^{th}$, $10^{th}$, $11^{th}$, $12^{th}$, $13^{th}$, $14^{th}$, $15^{th}$ data sets;
   the $13^{th}$ calibration bit (cb13)=checksum of all the bits of the $16^{th}$, $17^{th}$, $18^{th}$, $19^{th}$, $20^{th}$, $21^{th}$, $22^{th}$, $23^{th}$ data sets;
   the $14^{th}$ calibration bit (cb14)=checksum of all the bits of the $24^{th}$, $25^{th}$, $26^{th}$, $27^{th}$, $28^{th}$, $29^{th}$, $30^{th}$, $31^{th}$ data sets;
   the $23^{th}$ calibration bit (cb23)=checksum of a bit string which is formed by sequential assembly of all the bits $16^{th}$, $17^{th}$, $18^{th}$, $19^{th}$, $24^{th}$, $25^{th}$, $26^{th}$, $27^{th}$ data sets.

12. The method as claimed in claim 10, wherein the 22 calibration bits are:
   the $1^{th}$ calibration bit cb1=checksum of a bit string which is formed by sequential assembly of the $0^{th}$ bit (b0) and the $4^{th}$ bits (b4) of all the data sets;
   the $3^{th}$ calibration bit (cb3)=checksum of a bit string which is formed by sequential assembly of the bit (b1) and the $5^{th}$ bits (b5) of all the data sets;
   the $5^{th}$ calibration bit (cb5)=checksum of a bit string which is formed by sequential assembly of the $2^{th}$ bit (b2) and the $6^{th}$ bits (b6) of all the data sets;
   the $7^{th}$ calibration bit (cb7)=checksum of a bit string which is formed by sequential assembly of the $3^{th}$ bit (b3) and the $7^{th}$ bits (b7) of all the data sets;
   the $9^{th}$ calibration bit (cb9)=checksum of a bit string which is formed by sequential assembly of the $0^{th}$ bit (b0) to the $3^{th}$ bits (b3) of $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets;
   the $10^{th}$ calibration bit (cb10)=checksum of a bit string which is formed by sequential assembly of the $4^{th}$ bit (b4) to the $7^{th}$ bits (b7) of $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets;
   the $15^{th}$ calibration bit (cb15)=checksum of a bit string which is formed by sequential assembly of $0^{th}$ bit (b0) to the $3^{th}$ bit (b3) of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;
   the $16^{th}$ calibration bit (cb16)=checksum of a bit string which is formed by sequential assembly of $4^{th}$ bit (b4) and the $7^{th}$ bit (b7) of the $4^{th}$, $5^{th}$, $6^{th}$, $7^{th}$, $12^{th}$, $13^{th}$, $14^{th}$, $15^{th}$, $20^{th}$, $21^{th}$, $22^{th}$, $23^{th}$, $28^{th}$, $29^{th}$, $30^{th}$, $31^{th}$, data sets;
   the $17^{th}$ calibration bit (cb17)=checksum of a bit string which is formed by sequential assembly of $0^{th}$ bit (b0), the $1^{th}$ bit (b1), the $4^{th}$ bit (b4) and the $5^{th}$ bit (b5) of the $0^{th}$, $1^{th}$, $4^{th}$, $5^{th}$, $8^{th}$, $9^{th}$, $12^{th}$, $13^{th}$, $16^{th}$, $17^{th}$, $20^{th}$, $21^{th}$, $24^{th}$, $25^{th}$, $28^{th}$, $29^{th}$ data sets;
   the $18^{th}$ calibration bit (cb18)=checksum of a bit string which is formed by sequential assembly of $0^{th}$ bit (b0), the $2^{th}$ bit (b2), the $4^{th}$ bit (b4) and the $6^{th}$ bit (b6) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $25^{th}$, $28^{th}$, $30^{th}$ data sets;
   the $19^{th}$ calibration bit (cb19)=checksum of a bit string which is formed by sequential assembly of the $0^{th}$ bit (b0) to the $3^{th}$ bit (b3) of the $0^{th}$, $1^{th}$, $2^{th}$, $3^{th}$, $8^{th}$, $9^{th}$, $10^{th}$, $11^{th}$, $16^{th}$, $17^{th}$, $18^{th}$, $19^{th}$, $24^{th}$, $25^{th}$, $26^{th}$, $27^{th}$ data sets;
   the $20^{th}$ calibration bit (cb20)=checksum of a bit string which is formed by sequential assembly of the $0^{th}$ bit (b0), the $2^{nd}$ bit (b2), the $4^{th}$ bit (b4) and the $6^{th}$ bit (b6) of the $2^{th}$, $3^{th}$, $6^{th}$, $7^{th}$, $10^{th}$, $11^{th}$, $14^{th}$, $15^{th}$, $18^{th}$, $19^{th}$, $22^{th}$, $23^{th}$, $26^{th}$, $27^{th}$, $30^{th}$, $31^{th}$ data sets;
   the $21^{th}$ calibration bit (cb21)=checksum of a bit string which is formed by sequential assembly of the $2^{th}$ bit (b2), the $3^{rd}$ bit (b3) the $6^{th}$ bit (b6) and the $7^{th}$ bit (b7) of the $0^{th}$, $2^{th}$, $4^{th}$, $6^{th}$, $8^{th}$, $10^{th}$, $12^{th}$, $14^{th}$, $16^{th}$, $18^{th}$, $20^{th}$, $22^{th}$, $24^{th}$, $26^{th}$, $28^{th}$, $30^{th}$ data sets;
   the $22^{th}$ calibration bit (cb22)=checksum of a bit string which is formed by sequential assembly of the $0^{th}$ bit (b0) to the $3^{th}$ bit (b3) of the $8^{th}$, $9^{th}$, $10^{th}$, $11^{th}$, $12^{th}$, $13^{th}$, $14^{th}$, $15^{th}$, $24^{th}$, $25^{th}$, $26^{th}$, $27^{th}$, $28^{th}$, $29^{th}$, $30^{th}$, $31^{th}$ data sets;
   the $24^{th}$ calibration bit (cb24)=bit sum of a bit string which is formed by sequential assembly of all the bits of all the data sets;
   the $25^{th}$ calibration bit (cb25)=bit sum of a bit string which is formed by sequential assembly of all the bits of all the data sets;
   the $26^{th}$ calibration bit (cb26)=bit sum of a bit string which is formed by sequential assembly of all the bits of all the data sets;
   the $27^{th}$ calibration bit (cb27)=bit sum of a bit string which is formed by sequential assembly of all the bits of all the data sets;
   the $28^{th}$ calibration bit (cb28)=bit sum of a bit string which is formed by sequential assembly of all the bits of all the data sets;
   the $29^{th}$ calibration bit (cb29)=bit sum of a bit string which is formed by sequential assembly of all the bits of all the data sets;
   the $30^{th}$ calibration bit (cb30)=bit sum of a bit string which is formed by sequential assembly of all the bits of all the data sets;
   the $31^{th}$ calibration bit (cb31)=bit sum of a bit string which is formed by sequential assembly of all the bits of all the data sets.

13. The method as claimed in claim 11, wherein the $2^{nd}$ calibration bit (cb2); the $4^{th}$ calibration bit (cb4); the $6^{th}$ calibration bit (cb6); the $8^{th}$ calibration bit (cb8) data sets are used to determine the two or one data set including the error transfer bits.

14. The method as claimed in claim 12, wherein the 1st calibration bit (cb2); the $3^{th}$ calibration bit (cb3); the $5^{th}$ calibration bit (cb5); the $7^{th}$ calibration bit (cb7); the $17^{th}$ calibration bit (cb17); the $18^{th}$ calibration bit (cb18); the $19^{th}$ calibration bit (cb19); the $24^{th}$ calibration bit (cb20); the $21^{th}$ calibration bit (cb21) data sets are use to determine that positions of two data sets have the two error bits or positions of one data set have the two error bits.

15. The method as claimed in claim 8, wherein after correction, a new set of 256 bits is derived, the comparator calculating all the calibration bits from $0^{th}$ calibration bit (cb0) to $31^{th}$ calibration bit (cb31) as described above for the corrected new 256 bits; the results is compared with the $0^{th}$ calibration bit (cb0) to $31^{th}$ calibration bit (cb31) originally stored in the calibration chip; if all the calibration bits are identical, it means that the corrections are correct; if some calibration bits are different, it means that the numbers of the error bits in transfer are greater than 2.

* * * * *